US009028092B2

(12) United States Patent
Zhang et al.

(10) Patent No.: US 9,028,092 B2
(45) Date of Patent: May 12, 2015

(54) LED LIGHT BAR AND BACKLIGHT MODULE USING THE LED LIGHT BAR

(71) Applicant: Shenzhen China Star Optoelectronics Technology Co., Ltd., Shenzhen, Guangdong Province (CN)

(72) Inventors: Tian Zhang, Shenzhen (CN); Yuchun Hsiao, Shenzhen (CN)

(73) Assignee: Shenzhen China Star Optoelectronics Technology Co., Ltd., Shenzhen, Guangdong Province (CN)

( * ) Notice: Subject to any disclaimer, the term of this patent is extended or adjusted under 35 U.S.C. 154(b) by 24 days.

(21) Appl. No.: 13/806,751

(22) PCT Filed: Nov. 8, 2012

(86) PCT No.: PCT/CN2012/084262
§ 371 (c)(1),
(2) Date: Dec. 21, 2012

(87) PCT Pub. No.: WO2014/067173
PCT Pub. Date: May 8, 2014

(65) Prior Publication Data
US 2014/0119000 A1    May 1, 2014

(30) Foreign Application Priority Data

Oct. 31, 2012  (CN) .............................. 201210428301

(51) Int. Cl.
*F21V 29/00*     (2006.01)
*F21V 21/005*    (2006.01)

(52) U.S. Cl.
CPC ............... *F21V 29/22* (2013.01); *F21V 21/005* (2013.01)

(58) Field of Classification Search
CPC .............. H05K 2201/10106; F21Y 210/02; F21V 29/004; F21V 29/22; F21V 21/005; H01L 2224/48091
USPC ............. 362/218, 612, 608, 607, 294; 349/61
See application file for complete search history.

(56) References Cited

U.S. PATENT DOCUMENTS 6,966,674 B2 * 11/2005 Tsai ............................... 362/294
8,687,142 B2 *  4/2014 Lee et al. ......................... 349/61

(Continued)

FOREIGN PATENT DOCUMENTS

CN    1466782 A    1/2004
CN    1560672 A    1/2005

(Continued)

*Primary Examiner* — Thomas A Hollweg
(74) *Attorney, Agent, or Firm* — Cheng-Ju Chiang

(57) ABSTRACT

The present invention provides an LED light bar and a backlight module using the LED light bar. The LED light bar includes a heat dissipation strip, a PCB mounted on the heat dissipation strip, LED chips mounted on the heat dissipation strip and electrically connected to the PCB, and a thermal interface material layer arranged between the LED chips and the heat dissipation strip. The LED light bar and the backlight module using the LED light bar according to the present invention arrange LED chips to be mounted to a heat dissipation strip that is of bettered thermal conduction performance to thereby avoid the conventional process of transferring terminal energy through a PCB that is of poor heat dissipation. The art is simple and the entire heat dissipation path is shortened to achieve excellent heat dissipation performance and thus ensure the quality of backlighting.

9 Claims, 3 Drawing Sheets

(56) References Cited

U.S. PATENT DOCUMENTS

| | | | |
|---|---|---|---|
| 8,851,736 B2 * | 10/2014 | Lee et al. | 362/634 |
| 2004/0264195 A1 * | 12/2004 | Chang et al. | 362/294 |
| 2005/0180142 A1 * | 8/2005 | Tsai | 362/294 |
| 2008/0007963 A1 | 1/2008 | Hsieh | |
| 2009/0068856 A1 * | 3/2009 | Low | 439/56 |
| 2011/0025944 A1 * | 2/2011 | Lee et al. | 349/61 |
| 2013/0051062 A1 * | 2/2013 | Lee et al. | 362/602 |

FOREIGN PATENT DOCUMENTS

| | | |
|---|---|---|
| CN | 101017278 A | 8/2007 |
| CN | 102076166 A | 5/2011 |
| CN | 202103046 U | 1/2012 |
| CN | 202452303 U | 9/2012 |
| TW | 200846763 A | 12/2008 |

\* cited by examiner

LED LIGHT BAR AND BACKLIGHT MODULE USING THE LED LIGHT BAR

BACKGROUND OF THE INVENTION

1. Field of the Invention

The present invention relates to the field of liquid crystal displaying, and in particular to an LED (Light-Emitting Diode) light bar and a backlight module using the LED light bar.

2. The Related Arts

Liquid crystal display (LCD) has a variety of advantages, such as thin device body, low power consumption, and being free of radiation, and is thus widely used. Most of the LCDs that are currently available in the market are backlighting LCDs, which comprise a liquid crystal panel and a backlight module. The operation principle of the liquid crystal panel is that liquid crystal molecules are interposed between two parallel pieces of glass and a plurality of vertical and horizontal fine electrical wires is arranged between the two pieces of glass, whereby the liquid crystal molecules are controlled to change direction by application of electricity in order to refract out light emitting from the backlight module for generating images. Since the liquid crystal panel itself does not emit light, light must be provided by the backlight module in order to normally display images. Thus, the backlight module is one of the key components of an LCD. The backlight module can be classified in two types, namely side-edge backlight module and direct backlight module, according to the position where light gets incident. The direct backlight module comprises a light source, such as a cold cathode fluorescent lamp (CCFL) or a light-emitting diode (LED), which is arranged at the back side of the liquid crystal panel to form a planar light source that directly provides lighting to the liquid crystal panel. The side-edge backlight module comprises a backlighting source of an LED light bar arranged at an edge of a backplane that is located rearward of one side of the liquid crystal panel. The LED light bar emits light that enters a light guide plate (LGP) through a light incident face of the light guide plate and is projected out through a light emergence face of the light guide plate, after being reflected and diffused, to thereby form a planar light source for the liquid crystal panel.

In a heat dissipation arrangement of a conventional LED backlight module, LED chips are often soldered to a printed circuit board (PCB). The PCB is mounted to a heat dissipation strip by means of screws or thermally conductive adhesive. The heat dissipation strip is then mounted to a backplane. The PCB is often a metal core PCB (MCPCB) that shows improved heat dissipation or an FR4 substrate that comprises a copper layer and heat conduction through hole passage to improve heat transmission to a heat dissipation substrate. For the above two PCBs, the heat dissipation path of a backlight module is from the LED chips to a thermal interface material layer, and then sequentially through the PCB, a thermal interface material layer, the heat dissipation strip, and the backplane. Such a path is extended and shows poor heat dissipation performance due to PCB processing operation, so as to easily lead to over-temperature of the backlight module and thus affect the quality of backlighting.

SUMMARY OF THE INVENTION

An object of the present invention is to provide an LED light bar, which is of simple art, whereby the entire heat dissipation path is shortened to achieve bettered heat dissipation performance.

Another object of the present invention is to provide a backlight module, which comprises an LED light bar having excellent heat dissipation performance so as to improve the quality of backlight module.

To achieve the above objects, the present invention provides an LED light bar, which comprises a heat dissipation strip, a PCB mounted on the heat dissipation strip, LED chips mounted on the heat dissipation strip and electrically connected to the PCB, and a thermal interface material layer arranged between the LED chips and the heat dissipation strip.

The heat dissipation strip comprises a base and a raised portion provided on the base. The PCB is arranged on the base at two sides of the raised portion. The LED chips are mounted on the raised portion. The PCB is mounted to the base by means of soldering or adhesives. The LED chips are electrically connected to the PCB by soldering.

The base has a cross-sectional shape that is rectangular. The heat dissipation strip is of an inverted T-shape.

The base has a cross-sectional shape that is L-shaped, which comprises a first mounting section and a second mounting section perpendicularly mounted to the first mounting section. The raised portion is formed on the first mounting section.

The PCB comprises an FR4 board or an MCPCB.

The present invention also provides a backlight module, which comprises a backplane, a light guide plate arranged in the backplane, and an LED light bar mounted to the backplane. The LED light bar comprises a heat dissipation strip, a PCB mounted on the heat dissipation strip, LED chips mounted on the heat dissipation strip and electrically connected to the PCB, and a thermal interface material layer arranged between the LED chips and the heat dissipation strip.

The heat dissipation strip comprises a base and a raised portion provided on the base. The PCB is arranged on the base at two sides of the raised portion. The LED chips are mounted on the raised portion. The PCB is mounted to the base by means of soldering or adhesives. The LED chips are electrically connected to the PCB by soldering.

The base has a cross-sectional shape that is rectangular. The heat dissipation strip is of an inverted T-shape.

The base has a cross-sectional shape that is L-shaped, which comprises a first mounting section and a second mounting section perpendicularly mounted to the first mounting section. The raised portion is formed on the first mounting section.

The PCB comprises an FR4 board or an MCPCB.

The present invention further provides an LED light bar, which comprises a heat dissipation strip, a PCB mounted on the heat dissipation strip, LED chips mounted on the heat dissipation strip and electrically connected to the PCB, and a thermal interface material layer arranged between the LED chips and the heat dissipation strip;

wherein the heat dissipation strip comprises a base and a raised portion provided on the base, the PCB being arranged on the base at two sides of the raised portion, the LED chips being mounted on the raised portion, the PCB being mounted to the base by means of soldering or adhesives, the LED chips being electrically connected to the PCB by soldering;

wherein the base has a cross-sectional shape that is rectangular, the heat dissipation strip being of an inverted T-shape; and wherein the PCB comprises an FR4 board or an MCPCB.

The efficacy of the present invention is that the present invention provides an LED light bar and a backlight module using the LED light bar, wherein LED chips are mounted to a heat dissipation strip that is of bettered thermal conduction performance to thereby avoid the conventional process of transferring terminal energy through a PCB that is of poor heat dissipation. The art is simple and the entire heat dissipation path is shortened to achieve excellent heat dissipation performance and thus ensure the quality of backlighting.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, of the present invention will be apparent from the following detailed description of one or more embodiments of the present invention, with reference to the attached drawings. In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
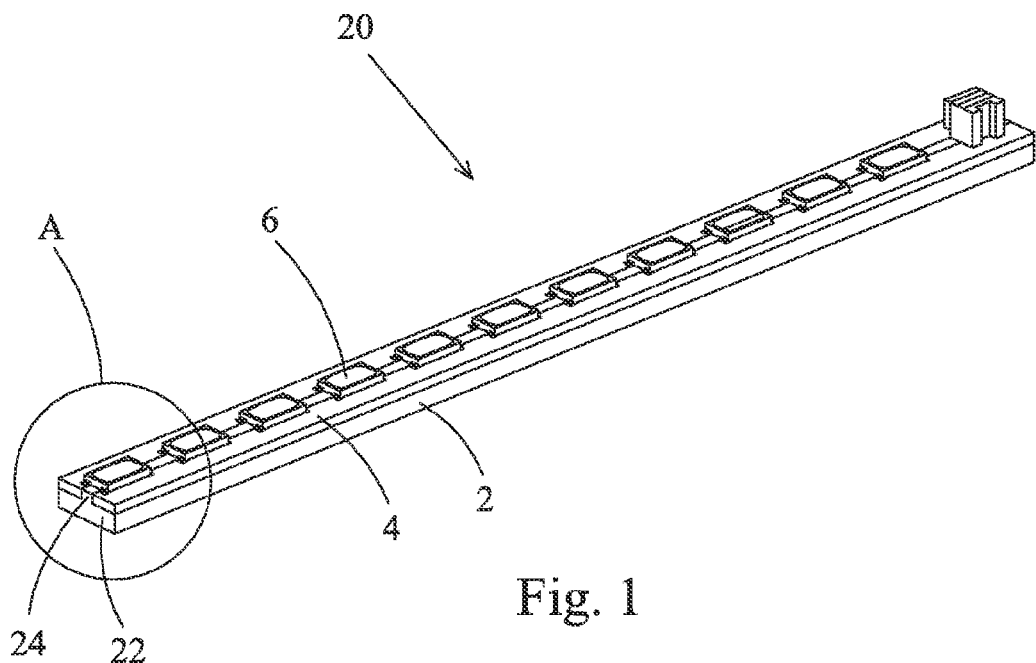
FIG. 1 is a schematic view showing an LED light bar according to an embodiment of the present invention.
Figure 2:
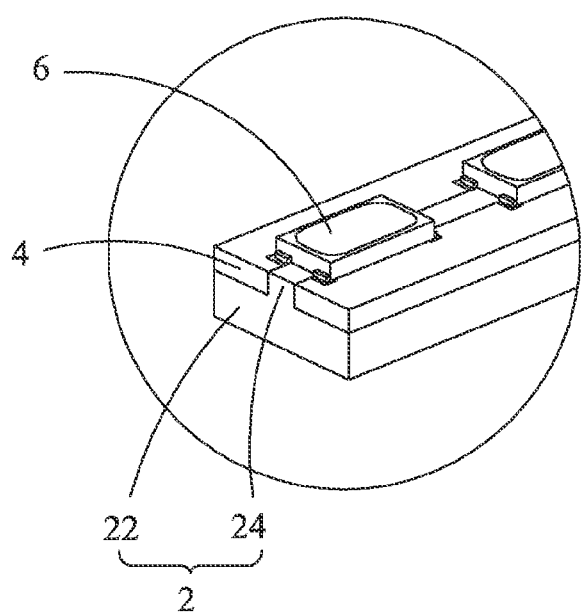
FIG. 2 is an enlarged view of the portion A of FIG. 1.
Figure 3:
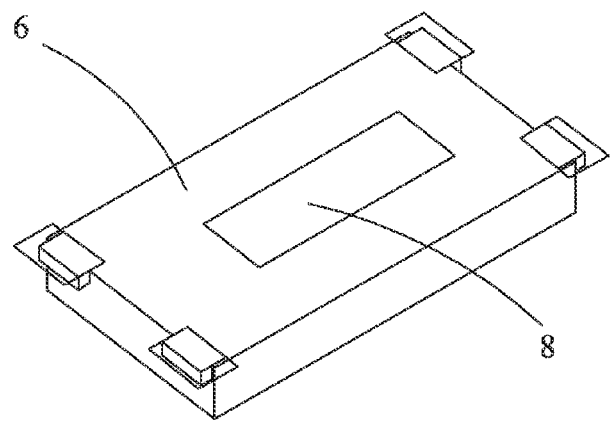
FIG. 3 is a schematic view showing an LED chip of FIG. 1.

Referring to FIGS. 1-3, the present invention provides an LED light bar 20, which comprises a heat dissipation strip 2, a PCB 4 mounted on the heat dissipation strip 2, LED chips 6 mounted on the heat dissipation strip 2 and electrically connected to the PCB 4, and a thermal interface material layer 8 arranged between the LED chips 6 and the heat dissipation strip 2. The LED chips 6 of the present invention are set in direct contact with the heat dissipation strip 2, whereby thermal energy emitting from the LED chips 6 is directly transferred through the thermal interface material layer 8 to the heat dissipation strip 2 to allow the heat dissipation strip 2 to exchange heat with the surrounding for achieving the heat dissipation mode of the LED light bar 20. Compared to the prior art heat exchange mode where the LED chips give off thermal energy that is transferred through the thermal interface material layer to the PCB to allow the PCB to exchange heat with the surrounding, the present invention provides a better performance of heat dissipation and the temperature of the LED light bar 20 can be effectively reduced to thereby extend the lifespan of the LED light bar 20.

The heat dissipation strip 2 is made of a material of high thermal conductivity, such as aluminum, and comprises a base 22 and a raised portion 24 provided on the base 22. The PCB 4 is an FR4 board or a MCPCB. The PCB 4 is arranged on the base 22 at two sides of the raised portion 24. The LED chips 6 are mounted on the raised portion 24. Preferably, the PCB 4 is mounted to the base 22 by means of soldering or adhesives. The LED chips 6 are electrically connected to the PCB 4 by soldering.

In the instant embodiment, the base 22 has a cross-sectional shape that is rectangular, whereby the heat dissipation strip 2 is of a form of an inverted T-shape.

The thermal interface material layer 8 can be a heat dissipation paste layer or a coating off heat dissipation material.

Figure 4:
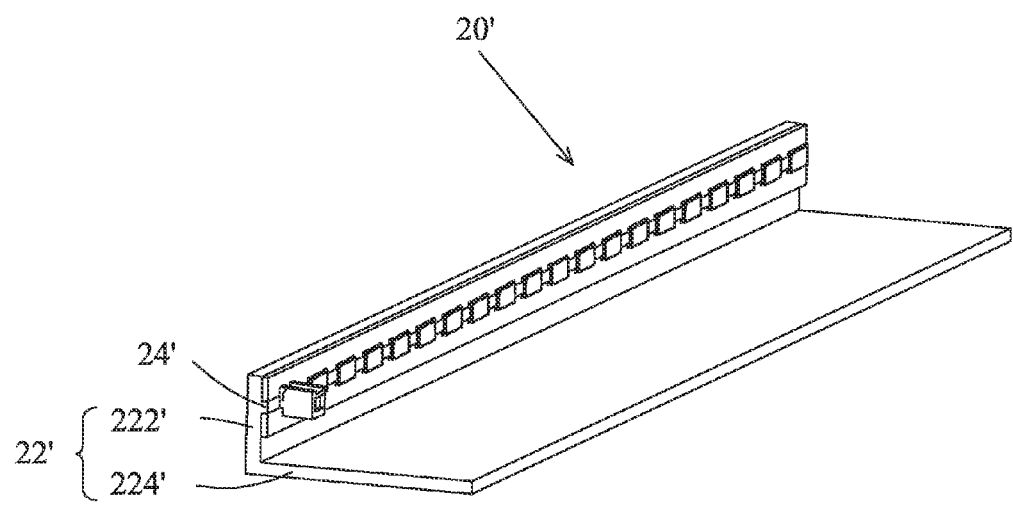
FIG. 4 is a schematic view showing an LED light bar according to another embodiment of the present invention.

Referring to FIG. 4, a schematic view is given to illustrate an LED light bar 20' according to another embodiment of the present invention. In the instant embodiment, the base 22' has a cross-sectional shape that is L-shaped, which comprises a first mounting section 222' and a second mounting section 224' perpendicularly mounted to the first mounting section 222'. The raised portion 24' is formed on the first mounting section 222'.

Figure 5:
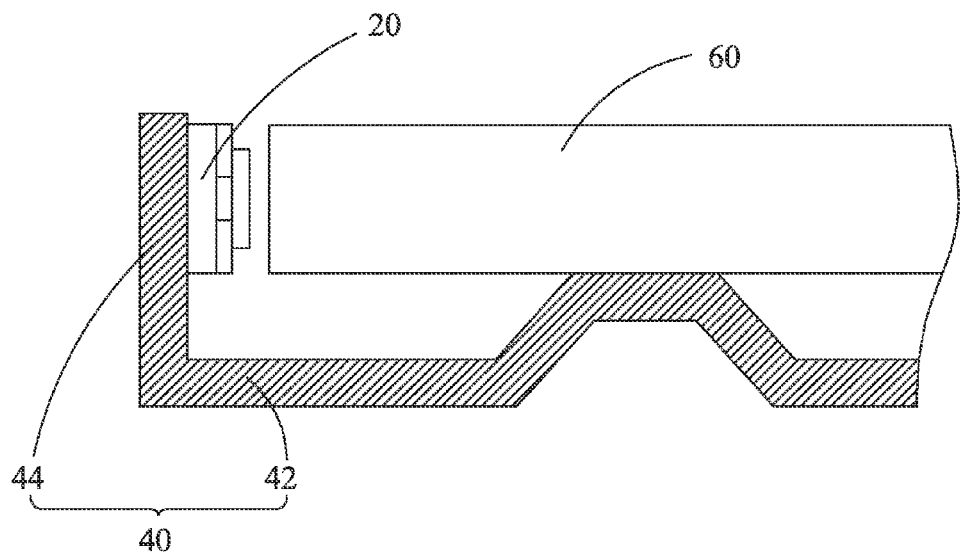
FIG. 5 is a schematic view showing a backlight module according to an embodiment of the present invention.

Referring to FIG. 5, with additional reference to FIGS. 1-3, the present invention also provides a backlight module, which comprises a backplane 40, a light guide plate 60 arranged inside the backplane 40, and an LED light bar 20 mounted to the backplane 40.

The LED light bar 20 comprises a heat dissipation strip 2, a PCB 4 mounted on the heat dissipation strip 2, LED chips 6 mounted on the heat dissipation strip 2 and electrically connected to the PCB 4, and a thermal interface material layer 8 arranged between the LED chips 6 and the heat dissipation strip 2. The LED chips 6 of the present invention are set in direct contact with the heat dissipation strip 2, whereby thermal energy emitting from the LED chips 6 is directly transferred through the thermal interface material layer 8 to the heat dissipation strip 2 and is further transferred from the heat dissipation strip 2 to a backplane 40 to allow the backplane 40 to exchange heat with the surrounding for achieving the heat dissipation mode of the LED light bar 20. Compared to the prior art heat exchange mode where the LED chips give off thermal energy that is transferred through the thermal interface material layer to the PCB and is then transferred from the PCB to the backplane to allow the backplane to exchange heat with the surrounding, the present invention provides a better performance of heat dissipation and the temperature of the LED light bar 20 and the backlight module can be effectively reduced to thereby extend the lifespan of the LED light bar 20 and also extend the lifespan of the backlight module.

The heat dissipation strip 2 is made of a material of high thermal conductivity, such as aluminum, and comprises a base 22 and a raised portion 24 provided on the base 22. The PCB 4 is an FR4 board or a MCPCB. The PCB 4 is arranged on the base 22 at two sides of the raised portion 24. The LED chips 6 are mounted on the raised portion 24. Preferably, the PCB 4 is mounted to the base 22 by means of soldering or adhesives. The LED chips 6 are electrically connected to the PCB 4 by soldering.

The backplane 40 comprises a bottom board 42 and a side board 44 perpendicularly connected to the bottom board 42. The LED light bar 20 is mounted to the side board 44 of the backplane 40.

In the instant embodiment, the base 22 has a cross-sectional shape that is rectangular, whereby the heat dissipation strip 2 is of a form of an inverted T-shape.

The thermal interface material layer 8 can be a heat dissipation paste layer or a coating off heat dissipation material.

Figure 6:
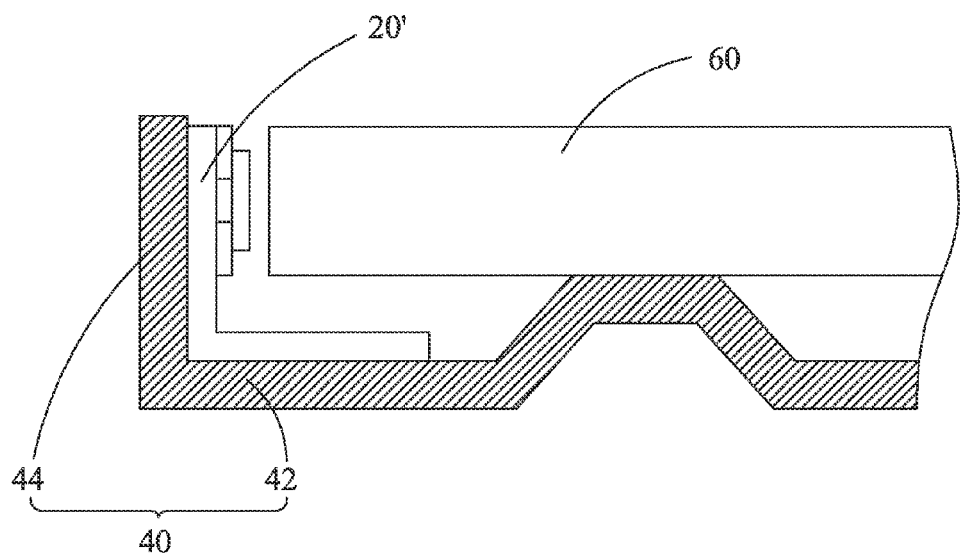
FIG. 6 is a schematic view showing a backlight module according to another embodiment of the present invention.

Referring to FIG. 6, a schematic view is given to illustrate a backlight module according to another embodiment of the present invention. Reference is also made to FIG. 4. In the instant embodiment, the base 22' of the heat dissipation strip 2' of the LED light bar 20' has a cross-sectional shape that is L-shaped, which comprises a first mounting section 222' and a second mounting section 224' perpendicularly mounted to the first mounting section 222'. The raised portion 24' is formed on the first mounting section 222'. The first mounting section 222' is mounted to the side board 44 of the backplane 40 and the second mounting section 224' is mounted to the bottom board 42 of the backplane 40.

In summary, the present invention provides an LED light bar and a backlight module using the LED light bar, wherein LED chips are mounted to a heat dissipation strip that is of bettered thermal conduction performance to thereby avoid the conventional process of transferring terminal energy through a PCB that is of poor heat dissipation. The art is simple and the entire heat dissipation path is shortened to achieve excellent heat dissipation performance and thus ensure the quality of backlighting.

Based on the description given above, those having ordinary skills of the art may easily contemplate various changes and modifications of the technical solution and technical ideas of the present invention and all these changes and modifications are considered within the protection scope of right for the present invention.

What is claimed is:

1. An LED (Light-Emitting Diode) light bar, comprising a heat dissipation strip, a printed circuit board (PCB) mounted on the heat dissipation strip, LED chips mounted on the heat dissipation strip and electrically connected to the PCB, and a thermal interface material layer arranged between the LED chips and the heat dissipation strip;

wherein the heat dissipation strip comprises an inverted T-shape that comprises a base and a raised portion that is an elongate continuous portion provided on the base and two recesses on opposite sides of the raised portion, the PCB comprising two split pieces respectively received in the recesses, the LED chips being distributed along the raised portion and spaced from each other, each of the LED chips being arranged astride the raised portion to electrically engage the two PCB pieces, the thermal interface material layer being sandwiched between a bottom of each of the LED chips and the raised portion of the T-shape of the heat dissipation strip.

2. The LED light bar as claimed in claim 1, wherein the PCB pieces are mounted to the base by means of soldering or adhesives, the LED chips being electrically connected to the PCB pieces by soldering.

3. The LED light bar as claimed in claim 2, wherein the base has a cross-sectional shape that is L-shaped, which comprises a first mounting section and a second mounting section perpendicularly mounted to the first mounting section, the raised portion being formed on the first mounting section.

4. The LED light bar as claimed in claim 1, wherein the PCB comprises an MCPCB (metal core printed circuit board).

5. A backlight module, comprising a backplane, a light guide plate arranged in the backplane, and an LED (Light-Emitting Diode) light bar mounted to the backplane, the LED light bar comprising a heat dissipation strip, a printed circuit board (PCB) mounted on the heat dissipation strip, LED chips mounted on the heat dissipation strip and electrically connected to the PCB, and a thermal interface material layer arranged between the LED chips and the heat dissipation strip;

wherein the heat dissipation strip comprises an inverted T-shape that comprises a base and a raised portion that is an elongate continuous portion provided on the base and two recesses on opposite sides of the raised portion, the PCB comprising two split pieces respectively received in the recesses, the LED chips being distributed along the raised portion and spaced from each other, each of the LED chips being arranged astride the raised portion to electrically engage the two PCB pieces, the thermal interface material layer being sandwiched between a bottom of each of the LED chips and the raised portion of the T-shape of the heat dissipation strip.

6. The backlight module as claimed in claim 5, wherein the PCB pieces are mounted to the base by means of soldering or adhesives, the LED chips being electrically connected to the PCB pieces by soldering.

7. The backlight module as claimed in claim 6, wherein the base has a cross-sectional shape that is L-shaped, which comprises a first mounting section and a second mounting section perpendicularly mounted to the first mounting section, the raised portion being formed on the first mounting section, the backplane comprising a bottom board and a side board perpendicularly connected to the bottom board, the first mounting section of the base being mounted to the side board, the second mounting section of the base being mounted to the bottom board of the backplane.

8. The backlight module as claimed in claim 6, wherein the PCB comprises an MCPCB (metal core printed circuit board).

9. An LED (Light-Emitting Diode) light bar, comprising a heat dissipation strip, a printed circuit board (PCB) mounted on the heat dissipation strip, LED chips mounted on the heat dissipation strip and electrically connected to the PCB, and a thermal interface material layer arranged between the LED chips and the heat dissipation strip;

wherein the heat dissipation strip comprises an inverted T-shape that comprises a base and a raised portion that is an elongate continuous portion provided on the base and two recesses on opposite sides of the raised portion, the PCB comprising two split pieces respectively received in the recesses, the LED chips being distributed along the raised portion and spaced from each other, each of the LED chips being arranged astride the raised portion to electrically engage the two PCB pieces, the thermal interface material layer being sandwiched between a bottom of each of the LED chips and the raised portion of the T-shape of the heat dissipation strip;

wherein the PCB pieces are mounted to the base by means of soldering or adhesives, the LED chips being electrically connected to the PCB pieces by soldering;

wherein the base has a cross-sectional shape that is rectangular; and wherein the PCB comprises an MCPCB (metal core printed circuit board).

* * * * *